(12) United States Patent
Kassubek et al.

(10) Patent No.: US 11,826,781 B2
(45) Date of Patent: Nov. 28, 2023

(54) ULTRASONIC TRANSDUCER FOR NON-INVASIVE MEASUREMENT

(71) Applicant: ABB Schweiz AG, Baden (CH)

(72) Inventors: Frank Kassubek, Rheinfelden (DE); Miklos Lenner, Daettwil (CH); Stefano Marano, Zurich (CH); Gerrit Held, Oberrohrdorf (CH)

(73) Assignee: ABB Schweiz AG, Baden (CH)

( * ) Notice: Subject to any disclaimer, the term of this patent is extended or adjusted under 35 U.S.C. 154(b) by 456 days.

(21) Appl. No.: 17/016,399

(22) Filed: Sep. 10, 2020

(65) Prior Publication Data

US 2021/0078040 A1 Mar. 18, 2021

(30) Foreign Application Priority Data

Sep. 13, 2019 (EP) .................................. 19197200

(51) Int. Cl.
| | | |
|---|---|---|
| *B06B 1/06* | (2006.01) | |
| *G01F 23/296* | (2022.01) | |
| *H01L 41/08* | (2006.01) | |
| *H01L 41/18* | (2006.01) | |
| *H01L 41/37* | (2013.01) | |
| *H10N 30/092* | (2023.01) | |

(Continued)

(52) U.S. Cl.
CPC .......... *B06B 1/067* (2013.01); *G01F 23/2968* (2013.01); *H10N 30/092* (2023.02); *H10N 30/1071* (2023.02); *H10N 30/852* (2023.02)

(58) Field of Classification Search
CPC .... B06B 1/067; H10N 30/092; H10N 30/852; H10N 30/1071; G01F 23/2968

USPC .......................................................... 310/336
See application file for complete search history.

(56) References Cited

U.S. PATENT DOCUMENTS

| | | |
|---|---|---|
| 4,446,395 A | 5/1984 | Hadjicostis |
| 5,115,414 A | 5/1992 | Atalar et al. |
| 5,164,920 A | 11/1992 | Bast et al. |

(Continued)

FOREIGN PATENT DOCUMENTS

| | | |
|---|---|---|
| DE | 102009046875 A1 | 5/2010 |
| EP | 1111351 A2 | 6/2001 |

(Continued)

OTHER PUBLICATIONS

Matteo Senesi et al. "Experimental characterization of periodic frequency-steerable arrays for structural health monitoring" Smart Materials and Structures, IOP Publishing Ltd., Bristol, GB, vol 19., No. 5, May 1, 2010.

(Continued)

*Primary Examiner* — Shawki S Ismail
*Assistant Examiner* — Monica Mata
(74) *Attorney, Agent, or Firm* — Leydig, Voit & Mayer, Ltd.

(57) ABSTRACT

An ultrasonic Lamb wave transducer for non-invasive measurement and for emitting and/or receiving an ultrasonic Lamb wave pulse, an emission and a reception of the ultrasonic Lamb wave having an emission direction and a reception direction, respectively, the ultrasonic Lamb wave pulse being defined by at least one parameter, includes: at least one piezocomposite actuator for controlling the emission direction of the ultrasonic Lamb wave by emitting acoustic radiation at frequencies that are appropriate for generating ultrasonic Lamb waves.

9 Claims, 2 Drawing Sheets

(51) Int. Cl.
*H10N 30/85* (2023.01)
*H10N 30/00* (2023.01)

(56) References Cited

U.S. PATENT DOCUMENTS

| | | | |
|---|---|---|---|
| 5,971,925 A | | 10/1999 | Hossack et al. |
| 6,291,928 B1* | | 9/2001 | Lazarus ................ H02N 2/043 |
| | | | 310/324 |
| 2001/0006318 A1 | | 7/2001 | Getman et al. |
| 2008/0163700 A1 | | 7/2008 | Huang |
| 2010/0043560 A1 | | 2/2010 | Andle et al. |
| 2010/0123367 A1 | | 5/2010 | Tai et al. |
| 2014/0117814 A1 | | 5/2014 | Toda et al. |
| 2016/0320219 A1 | | 11/2016 | Hellevang et al. |
| 2017/0010146 A1* | | 1/2017 | Kassubek ........... G01S 7/52004 |

FOREIGN PATENT DOCUMENTS

| | | |
|---|---|---|
| EP | 1111585 A2 | 6/2001 |
| EP | 3115753 A1 | 1/2017 |
| WO | WO 2016063117 A1 | 4/2016 |
| WO | WO 2018204723 A1 | 11/2018 |

OTHER PUBLICATIONS

Sakharov V E et al. "Liquid level sensor using ultrasonic Lamb Waves" Ultrasonics; IPC Science and Technology Press Ltd, Guildford, GB, vol. 41, No. 4, Jun. 1 2003.

Badcock et al., "The use of 0-3 piezocomposite embedded Lamb wave sensors for detection of damage in advanced fibre composites," *Smart Materials and Structures*, 9(3): 291-297 (Jun. 1, 2000).

Porchez et al., "Piezo-composite transducer for mode and direction selectivity of Lamb waves," downloaded from the Internet on Mar. 28, 2023, at https://www.cedrat-technologies.com/fileadmin/user_upload/CTEC/Publications/Publications/2010/09/piezo_composite_SENSOR_2010.pdf, 6 pp. (May 19, 2010).

Salas et al., "Guided wave excitation by a CLoVER transducer for structural health monitoring: theory and experiments," *Smart Materials and Structures*, 18(7): 075005, 27 pp. (Jul. 1, 2009).

Wright et al., "Polymer composite material characterisation using a laser/air-transducer system," *Ultrasonics*, 34(8): 825-833 (Dec. 1, 1996).

European Patent Office, Office Action in European Patent Application No. 19197200.9, 8 pp. (dated Jun. 13, 2023).

* cited by examiner

ULTRASONIC TRANSDUCER FOR NON-INVASIVE MEASUREMENT

CROSS-REFERENCE TO PRIOR APPLICATION

Priority is claimed to European Patent Application No. EP 19 197 200.9, filed on Sep. 13, 2019, the entire disclosure of which is hereby incorporated by reference herein.

FIELD

The present invention relates to an ultrasonic wave transducer for non-invasive measurement, a controller and a method for manufacturing an ultrasonic transducer for non-invasive measurement.

BACKGROUND

Ultrasonic transceivers are used in medical applications to scan, for example, an organ, or in mechanical applications to investigate a material for possible damages, which can be performed by ultrasonic technology in a non-destructive way. Further, they can be applied for, e.g., level measurements of a liquid or tissue in a vessel. In these cases, an ultrasonic wave is emitted by an ultrasonic device, usually at the top or bottom of a vessel, and the echoes of the same frequency (or higher harmonics) are reflected from the level interface back to the device, which receives the echoes. That is, a straight sound beam, parallel to the tank wall is used.

Since the bottom of a vessel is often not accessible, the measurement may be performed by attaching ultrasonic devices at the side wall of the vessel. A non-invasive level measurement of, for example, a liquid in a tank, may thus be performed by a transmitter and a receiver. The transmitter is placed at a first position at the outside of the vessel wall and below the level of the liquid surface. The transmitter emits an ultrasound wave as a primary wave into the vessel wall so that a part of the primary Lamb wave leaks from the vessel wall into the liquid in form of a pressure wave in an inclined and upward direction towards the liquid surface.

The receiver is placed at a second position at the outside of the vessel wall and below the level of the liquid surface in such a way that the receiver is able to receive a secondary, wave which is generated by the pressure wave hitting the vessel wall after having been reflected by the liquid surface.

Therefore, for non-invasive measurements, e.g., time of flight measurements, there is a desire to have the possibility to control the direction of the sound beam that is adapted according to certain conditions. The term "time of flight" relates to the time which elapses between emission and reception of a signal. For example, the measurement of level from the side of the tank requires the sound beam angle to be adjusted such that the beam reflected from the liquid surface hits the receiver. Since the level to be measured is not constant, the direction of the transmitted wave has to be varied. A type of transmitter is desired, that is able to steer a sound wave in a broad angular range and with a sufficient amplitude. As the angular control of Lamb-waves is directly related to the wavelength of the acoustic field, a large angular tunability requires a broad bandwidth of the electroacoustic transducing element in the frequency domain.

SUMMARY

In an embodiment, the present invention provides an ultrasonic Lamb wave transducer for non-invasive measurement and configured to emit and/or receive an ultrasonic Lamb wave pulse, an emission and a reception of the ultrasonic Lamb wave having an emission direction and a reception direction, respectively, the ultrasonic Lamb wave pulse being defined by at least one parameter, the ultrasonic Lamb transducer comprising: at least one piezocomposite actuator configured to control the emission direction of the ultrasonic Lamb wave by emitting acoustic radiation at frequencies that are appropriate for generating ultrasonic Lamb waves.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
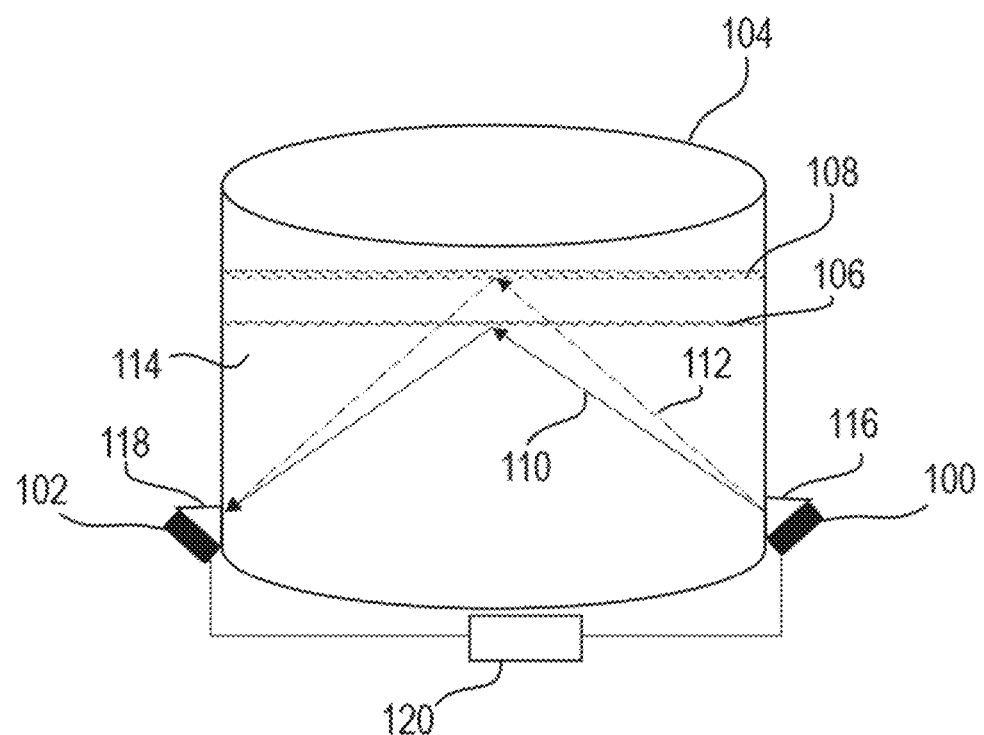
FIG. 1 shows a sketch of a non-invasive level measurement of a liquid in a vessel.

The described embodiments similarly pertain to the ultrasonic Lamb wave transducer method for manufacturing an ultrasonic transducer for non-invasive measurement, the use of an ultrasonic Lamb wave transducer and the controller for controlling the radiation angle of an acoustic beam in a medium. Synergetic effects may arise from different combinations of the embodiments although they might not be described in detail.

Further on, it shall be noted that all embodiments of the present invention concerning a method, might be carried out with the order of the steps as described, nevertheless this has not to be the only and essential order of the steps of the method. The herein presented methods can be carried out with another order of the disclosed steps without departing from the respective method embodiment, unless explicitly mentioned to the contrary hereinafter.

Technical terms are used by their common sense. If a specific meaning is conveyed to certain terms, definitions of terms will be given in the following in the context of which the terms are used.

Transmitters that convert electric energy into acoustic energy and receivers that convert acoustic energy into electric energy are called transducers in this disclosure.

According to a first aspect, an ultrasonic Lamb wave transducer for non-invasive measurement is provided. The transducer is configured to emit or receive an ultrasonic Lamb wave pulse for the measurement. The emission and the reception of the ultrasonic Lamb wave (110, 112) each have a direction, and the pulse is defined by at least one parameter. The measurement is based on an emission direction or receiving direction of the ultrasonic Lamb wave and at least one parameter describing the pulse. The ultrasonic Lamb transducer comprises a piezocomposite actuator, which is configured to control the emission direction of the ultrasonic Lamb wave by emitting acoustic radiation at frequencies that are appropriate for the generation of ultrasonic Lamb waves. The term "Lamb wave pulse" expresses a short emission of the wave with respect to time.

According to an embodiment, the at least one pulse parameter is one of carrier frequency shift, time of flight, pulse width, attenuation, pulse amplitude, or a combination of thereof.

That is, for example, in a time of flight measurement application such as a level measurement, where a travel path of the wave is not straight but runs from an emitting point to a reflection point and from the reflection point to a receiving point, the reflection point has to be hit such that the reflected beam hits the receiver. E.g., in case of level measurements, for finding the exact reflection point at which the receiver detects a maximum of energy of the received waves, the beam of the ultrasonic wave has to be steered to different angles until the maximum of energy is found. With known positions of the transmitter and receiver, the level of, e.g., the liquid can be calculated based on the knowledge of the emitting angle and the length of the propagation path. Having found the maximum received energy at a certain frequency, the current emitting angle is known by the pre-determined relation between the frequency and the angle. It has to be noted that the invention is not limited to such an arrangement. Depending on the geometry of the emitting and receiving transducer positions, the size of the vessel, and the level, a wide range of beam emission angles might be required. As the angular variability is realized by the generation of Lamb-waves, this requirement translates into the need for an electroacoustic transducing element with high frequency bandwidth. This need can be satisfied by using a piezocomposite actuator in a transducer. A piezocomposite actuator allows the electroacoustic conversion in a wide frequency range at high conversion efficiency. The frequency is controlled within a frequency range that results from the properties of the piezocomposite.

The piezocomposite actuator can be adapted by adjusting its properties, such as the quality factor, which is responsible for the achievable bandwidth, which affects the angular variability of the emitted acoustic beam when using Lamb-waves. The quality factor (Q factor) is influenced by the elastic stiffness and viscosity of the piezocomposite that is also related to acoustic losses. In general, a piezocomposite actuator has a lower quality factor than a typically used piezoceramic one and has hence a wider bandwidth. The broad bandwidth is advantageous not only for the generation of short pulses (that may be desired for some applications) but also for exciting Lamb waves. The variation of excitation frequencies within a large frequency range results in a wide range of radiation angles for the emitted Lamb-waves. The variation of the center frequencies can be accomplished at sufficiently high acoustic amplitudes.

A suitable type of waves are Lamb waves, also called plate waves. Lamb waves are mechanical waves generated in plates where the wave propagation is influenced by the reflection of the wave at the sides of the walls and the thus limited propagation space. They thus show similar properties as waves propagating in wave guides. In plates in a gaseous medium or in vacuum, the waves are reflected totally at the sides of the plate and are thus kept inside the plate. In the case of a contact of the plate with a liquid, the reflectivity of the interface is reduced and the Lamb waves can emit acoustic energy into the surrounding liquid medium. Due to the emitting of acoustic energy into the surrounding medium, they are also called leaky Lamb waves. For a leaky Lamb wave, the angle of the emitted sound waves into the liquid when measured with respect to the tank wall depends on the frequency of the sound waves. Hence, by coupling to Lamb waves with different frequencies, it is possible to change the direction of the emitted beam.

In some applications, other pulse parameters, such as carrier frequency shift, pulse duration or pulse width, or pulse amplitude of the received pulse is measured and the difference of the values between emitted and received pulse is determined.

According to an embodiment, the base material of the piezocomposite actuator is a piezoceramic material. Variants of the piezoceramic material may be Lead Zirconate Titanate (PZT), PZT4 and PZT8. Alternatively, (Bi,Na)TiO3-(BNT-) or BT-BaTiO3-(BT-) based ceramics may be used. Typically, standard PZT material is used for the actuation. PZT is a low-cost and commercially available material. It has a high electromechanical coupling factor, which allows efficient generation of sound waves. Since piezoceramic elements typically have a narrow bandwidth, they can be used only near their Eigen-resonances with reasonable efficiency.

According to a further embodiment, the piezocomposite actuator comprises a polymer as composite material, so that the piezocomposite actuator comprises a combination of the polymer and a piezoceramic material. Examples for polymer materials are spurr resin or Poss EP3512 resin.

According to an embodiment, the piezocomposite element is mounted, e.g., on a nylon wedge, which has optimal material properties for coupling the sound waves, including shear waves, in the tank wall to generate Lamb waves.

Emanating from pure piezoceramics, which have, as mentioned above, a high mechanical quality factor restricting the bandwidth of the resonances of the system to a narrow frequency range, a polymer material is added to decrease the quality factor, so that a broadband behavior with greater bandwidth is obtained. At the same time, due to the piezoceramic content, the high electromechanical coupling factor is nearly pertained or decreased only slightly. Due to the polymer content, the acoustic impedance of piezocomposites is closer to that of the host material (which may be, e.g., nylon for the transducer wedge), which results in a significantly enhanced acoustic coupling between actuator and transducer substrate. The two effects, i.e., low quality factor and improved acoustic coupling, allow for creating an actuator that can excite vibrations with large amplitudes very efficiently over a broad frequency range, which leads to an enhanced angular variability in turn.

As an example, a PZT material may have a mechanical quality factor of $Q_e=950$. If a polymer with quality factor of $Q_p=50$ is added (e.g., PZT8-Epotek in combination with Duralco128) with a volume fraction $v=0.5$, the quality factor of the material combination is approximately $Q \sim 1/(v/Q_e + (1-v)/Q_p)$. in this example, $Q=95$ is obtained. As the bandwidth of the transducer is proportional to $1/Q$, by changing the material from pure piezoceramics to a composite, the bandwidth is increased by a factor of 10. At the same time, the piezoelectric properties (coupling to the voltage) have decreased only linearly with v, i.e., by a factor of 2. This illustrates the gain by using a composite material.

According to a further embodiment, the transducer is wedge shaped, wherein the wedge is adapted to host the piezocomposite actuator. The different sound velocities in the metal and the plate result in different wavelengths. Resonance conditions for the different wave lengths are therefore fulfilled at a certain angle that depends on the different wavelengths and thus on the velocities in the metal plate of the vessel and the wedge. A high amplitude of the Lamb wave is therefore obtained introducing the wave from the transducer at an angle θ fulfilling the condition cos θ=$c_{wedge}/c_w(f)$, where $c_{wedge}$ is the sound velocity in the wedge and $c_w(f)$ is the frequency dependent sound velocity in the plate. Similarly, the radiation angle from the plate into the liquid is cos α=$c_L/c_w(f)$ where α is the angle between the wall and the pressure wave, $c_L$ is the speed of sound in the liquid and $c_w(f)$ is the frequency-dependent phase velocity of the Lamb wave, also called the primary Lamb wave, in the wall. Due to the frequency dependence (dispersion) of $c_w(f)$, changing the frequency results in the variation of α.

According to an embodiment, the transducer comprises a backing layer and at least one matching layer, wherein at least one side of the backing layer and/or the matching layer has a curved shape.

Composite structures can be used in wedge-like arrangements (as PZTs), also combined with appropriate backing and matching layers. Additionally, they can be produced in arbitrary shapes, for example, curved shapes, and with predefined anisotropy. This can be used, for example, to focus the sound beam onto a portion of the metal plate (using a "lens" effect) or by adjusting the shape of the eigenmodes such that the emitted wave pattern suppresses undesired side lobes, which can occur, for example, due to shear and longitudinal waves excited by the actuator. One may suppress some of these waves or change their temporal/spatial distribution by appropriate shape design.

A piezocomposite can thus be used as simple replacement of a typical piezoceramic element. This takes advantage of the better acoustic properties as discussed above. Additionally, one may take advantage of the numerous fabrication parameters of piezocomposites (e.g. fiber distribution, convex or concave shape for focusing the sound beam, etc.) in order to optimize the Lamb wave excitation.

According to a further embodiment, the transducer is a transmitter or a receiver. Since for the reception the same properties apply in the reverse direction, the transducer is also deployable as receiver. Consequently, a symmetrical geometrical arrangement is advantageous. Alternatively, as receiver a typical PZT ultrasonic sensor might be used.

According to an aspect, a controller is provided which is configured to control a non-invasive measurement system comprising ultrasonic Lamb wave transducers as discussed above. The controller may be configured to control the transmitter and the receiver. In an example of a level measurement, it therefore controls a) the transmitter to emit the primary Lamb wave at different frequencies, b) determines for each of the different frequencies the time of flight of the pressure wave and/or the amplitude of the received secondary Lamb wave, c) changes the frequency of the transmitter until the determined time of flight reaches a minimum or until the determined amplitude reaches a maximum, and d) determines the liquid level based on the relationship between the measured time-of-flight, the pulse propagation path and the speed of sound in the involved media. In this level measurement example, the radiation angle between the pressure wave and a horizontal axis is between zero and ninety degrees.

Further, the controller may be connected to other devices to which it sends the measurement results. Such devices may be, for example, a display, a near-field communication device comprising a client-server-architecture, a server, or further point-to-point or cloud devices, which may be connected wirelessly using for example a Bluetooth or mobile communication connection, or which may be connected by wire.

The controller may therefore comprise a control unit with, e.g., a microcontroller, a storage medium, communication units, power circuits, etc. The storage medium may provide memory for the measurement data and for a program, e.g., a computer program or an embedded program, which is run by the microcontroller.

According to a further aspect, the ultrasonic Lamb wave transducer can be used for time-of-flight measurement, e.g., in an level measurement arrangement as described above. Further applications include additional non-invasive measurements, including, for example, acoustic tomography, in which control of the beam angle is beneficial.

According to a further aspect, a method for manufacturing an ultrasonic transducer for non-invasive measurement is provided. The method comprises the steps providing a piezoceramic material (e.g., Lead Zirconate Titanate (PZT)) as base for an ultrasonic actuator for emitting ultrasonic waves, adding a composite material to the piezoceramic material to form piezocomposite ultrasonic actuator, and embedding or attaching the ultrasonic actuator in/on a host material to form the ultrasonic transducer.

According to an embodiment, the step of adding a composite material to the piezoceramic material is performed using one of the following techniques: rod placement technique, dice-fill technique, ultrasonic cutting, injection molding, lost mold, laser machining, co-extrusion, tape lamination, and fiber insertion methods, which are known to a person skilled in the art.

FIG. 1 shows an example of a non-invasive level measurement of a liquid in a vessel 104 performed by a transmitting element 100 mounted on a wedge 116 and a receiving element 102 mounted on a wedge 118, each representing a transducer as described above. Transmitter 100 is placed at a first position at the outside of the vessel wall and below the level of the liquid surface 106 or 108, respectively. Transmitter 100 emits an ultrasound wave as a primary wave into the vessel wall so that a part of the primary Lamb wave leaks from the vessel wall into the liquid 114 in form of a pressure wave 110 or 112, resp., in an inclined and upward direction towards the liquid surface 106, 108. Receiver 102 is placed at a second position opposite to the transmitter 100, also at the outside of the vessel wall and below the level of the liquid surface 106, 108. The pressure wave is reflected at the surface 106, 108 at a reflection point in such a way that the receiver is able to receive a secondary wave which is generated by the pressure wave hitting the vessel wall after having been reflected by the liquid surface 106, 108. In FIG. 1 the generation of Lamb waves leaking into the liquid at two different angles is illustrated. The first beam 110 is reflected at the surface 106 at a lower level, and the second beam 112 reflected at the surface 108 at a second level. The level interface is perpendicular to the tank walls, so that the beams are received at the same angles as they are emitted.

The controller 120 is connected to the transmitter 100 and the receiver 102. It may further provide an interface to a server or a display (not shown in FIG. 1). The interfaces to the transmitter, receiver, server, and/or a display may be realized by a wired or a wireless connection.

Figure 2:
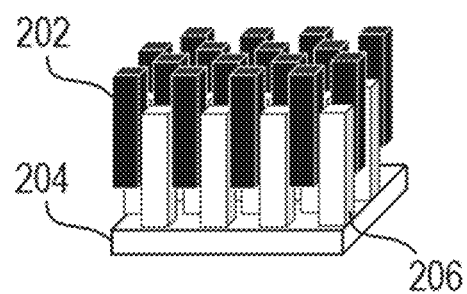
FIG. 2 shows an example of a piezocomposite based on a dice-and-fill manufacturing technique.

FIG. 2 shows an example of a piezocomposite based on a dice-and-fill manufacturing technique, where epoxy 202 as composite material fills diced posts 206 of a relaxor-PT (lead titanate) material. The PT base plate 204 is removed after the filling.

Figure 3:
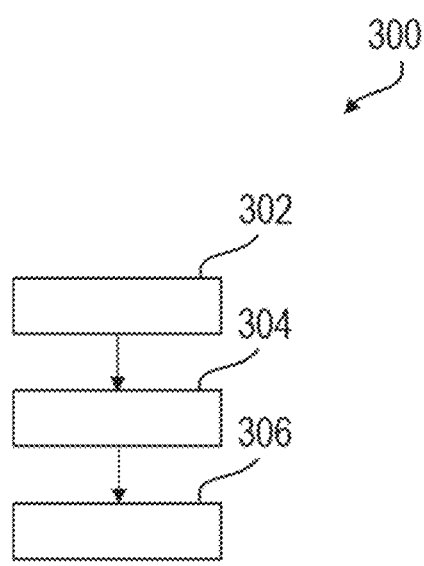
FIG. 3 shows a flow diagram of a method for manufacturing an ultrasonic transducer for non-invasive measurement.

FIG. 3 shows a flow diagram of a method for manufacturing an ultrasonic transducer for non-invasive measurement. In a first step 302, a piezoceramic material as base for an ultrasonic actuator for emitting ultrasonic waves is provided. In a second step 304, a composite material to the piezoceramic material to form piezocomposite ultrasonic actuator is added, and in a further step 306, the ultrasonic actuator is embedded in or attached on a host material to form the ultrasonic transducer.

Other variations to the disclosed embodiments can be understood and effected by those skilled in the art in practicing the claimed invention, from the study of the drawings, the disclosure, and the appended claims. In the claims the word "comprising" does not exclude other elements or steps and the indefinite article "a" or "an" does not exclude a plurality. A single processor or other unit may fulfill the functions of several items or steps recited in the claims. The mere fact that certain measures are recited in mutually different dependent claims does not indicate that a combination of these measures cannot be used to advantage. A computer program may be stored/distributed on a suitable medium such as an optical storage medium or a solid-state medium supplied together with or as part of other hardware, but may also be distributed in other forms, such as via the Internet or other wired or wireless telecommunication systems. Any reference signs in the claims should not be construed as limiting the scope of the claims.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An ultrasonic Lamb wave transducer for non-invasive measurement and configured to emit and/or receive an ultrasonic Lamb wave pulse, an emission and a reception of the ultrasonic Lamb wave pulse having an emission direction and a reception direction, respectively, the ultrasonic Lamb wave pulse being defined by at least one parameter, the ultrasonic Lamb transducer comprising:
   at least one piezocomposite actuator configured to control the emission direction of the ultrasonic Lamb wave pulse by emitting acoustic radiation at frequencies that are appropriate for generating ultrasonic Lamb wave pulses,
   wherein the frequencies are controlled within a frequency range resulting from properties of a composition of a piezocomposite of the at least one piezocomposite actuator.

2. The ultrasonic Lamb wave transducer according to claim 1, wherein the at least one parameter is one of carrier frequency shift, time of flight, pulse width, attenuation, pulse amplitude, or a combination thereof.

3. The ultrasonic Lamb wave transducer according to claim 1, wherein the at least one piezocomposite actuator comprises a polymer as composite material.

4. The ultrasonic Lamb wave transducer according to claim 1, wherein a base material of the at least one piezocomposite actuator comprises a piezoceramic material comprising Lead Zirconate Titanate (PZT).

5. The ultrasonic Lamb wave transducer according to claim 1, wherein the ultrasonic Lamb wave transducer comprises a wedge, and
   wherein the wedge is configured to host the at least one piezocomposite actuator.

6. The ultrasonic Lamb wave transducer according to claim 1, further comprising a backing layer and at least one matching layer,
   wherein at least one side of the backing layer and/or the at least one matching layer has a plain or curved shape.

7. The ultrasonic Lamb wave transducer according to claim 1, wherein the ultrasonic Lamb wave transducer comprises a transmitter or a receiver.

8. A controller configured to control a non-invasive measurement system, comprising:
   the ultrasonic Lamb wave transducer according to claim 1.

9. A method of using the ultrasonic Lamb wave transducer according to claim 1 for a level measurement.

* * * * *